(12) United States Patent
Tsai et al.

(10) Patent No.: US 9,929,143 B2
(45) Date of Patent: *Mar. 27, 2018

(54) N-TYPE METAL OXIDE SEMICONDUCTOR (NMOS) TRANSISTOR FOR ELECTROSTATIC DISCHARGE (ESD)

(71) Applicant: Taiwan Semiconductor Manufacturing Company Limited, Hsin-Chu (TW)

(72) Inventors: Tsung-Che Tsai, Hsinchu (TW); Jam-Wem Lee, Hsinchu (TW)

(73) Assignee: TAIWAN SEMICONDUCTOR MANUFACTURING COMPANY LTD., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/967,546

(22) Filed: Dec. 14, 2015

(65) Prior Publication Data
US 2016/0099241 A1 Apr. 7, 2016

Related U.S. Application Data

(63) Continuation of application No. 13/731,181, filed on Dec. 31, 2012, now Pat. No. 9,214,540.

(51) Int. Cl.
*H01L 29/10* (2006.01)
*H01L 27/02* (2006.01)
(Continued)

(52) U.S. Cl.
CPC ........ *H01L 27/0266* (2013.01); *H01L 27/027* (2013.01); *H01L 29/0649* (2013.01);
(Continued)

(58) Field of Classification Search
CPC .............. H01L 27/027; H01L 27/0266; H01L 29/0649; H01L 29/0804; H01L 29/0821;
(Continued)

(56) References Cited

U.S. PATENT DOCUMENTS 5,719,427 A 2/1998 Tong et al.
5,917,219 A * 6/1999 Nandakumar ...... H01L 29/1045
257/327
(Continued)

*Primary Examiner* — Trung Q Dang
*Assistant Examiner* — Patricia Reddington
(74) *Attorney, Agent, or Firm* — Cooper Legal Group, LLC

(57) ABSTRACT

One or more techniques or systems for forming an n-type metal oxide semiconductor (NMOS) transistor for electrostatic discharge (ESD) are provided herein. In some embodiments, the NMOS transistor includes a first region, a first n-type plus (NP) region, a first p-type plus (PP) region, a second NP region, a second PP region, a shallow trench isolation (STI) region, and a gate stack. In some embodiments, the first PP region is between the first NP region and the second NP region. In some embodiments, the second NP region is between the first PP region and the second PP region, the gate stack is between the first PP region and the second NP region, the STI region is between the second NP region and the second PP region. Accordingly, the first PP region enables ESD current to discharge based on a low trigger voltage for the NMOS transistor.

20 Claims, 5 Drawing Sheets

(51) Int. Cl.
*H01L 29/78* (2006.01)
*H01L 29/06* (2006.01)
*H01L 29/08* (2006.01)
*H01L 29/40* (2006.01)
*H01L 29/739* (2006.01)

(52) U.S. Cl.
CPC ...... *H01L 29/0804* (2013.01); *H01L 29/0821* (2013.01); *H01L 29/1004* (2013.01); *H01L 29/1095* (2013.01); *H01L 29/405* (2013.01); *H01L 29/7393* (2013.01); *H01L 29/78* (2013.01)

(58) Field of Classification Search
CPC ............. H01L 29/1004; H01L 29/1095; H01L 29/405; H01L 29/7393; H01L 29/78; H01L 2924/0002
USPC .......................................................... 257/43
See application file for complete search history.

(56) References Cited

U.S. PATENT DOCUMENTS

| | | | | |
|---|---|---|---|---|
| 6,858,901 | B2* | 2/2005 | Ker | H01L 27/027 |
| | | | | 257/355 |
| 7,910,999 | B2* | 3/2011 | Lee | H01L 27/0255 |
| | | | | 257/355 |
| 2005/0280091 | A1* | 12/2005 | Huang | H01L 27/0255 |
| | | | | 257/355 |
| 2008/0067587 | A1* | 3/2008 | Gossner | H01L 21/84 |
| | | | | 257/336 |
| 2010/0103570 | A1* | 4/2010 | Song | H01L 29/7436 |
| | | | | 361/56 |
| 2013/0277745 | A1* | 10/2013 | Tsai | H01L 27/0259 |
| | | | | 257/355 |

* cited by examiner

N-TYPE METAL OXIDE SEMICONDUCTOR (NMOS) TRANSISTOR FOR ELECTROSTATIC DISCHARGE (ESD)

RELATED APPLICATION

This application is a continuation of and claims priority to U.S. patent application Ser. No. 13/731,181, titled "N-TYPE METAL OXIDE SEMICONDUCTOR (NMOS) TRANSISTOR FOR ELECTROSTATIC DISCHARGE (ESD)" and filed on Dec. 31, 2012, which is incorporated herein by reference.

BACKGROUND

Generally, an n-type metal oxide semiconductor (NMOS) transistor is used in electrostatic discharge (ESD) circuitry. For example, an NMOS ESD transistor generally comprises an implant. It will be appreciated that an implant is generally associated with an additional fabrication procedure, such as a mask, for example.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for forming an n-type metal oxide semiconductor (NMOS) transistor for electrostatic discharge (ESD) are provided herein. Generally, NMOS transistors used in ESD circuitry requires an implant. However, in some embodiments, an NMOS transistor for ESD does not comprise an implant. For example, the NMOS transistor comprises a first region, a first n-type plus (NP) region, a first p-type plus (PP) region, a second NP region, a second PP region, a shallow trench isolation (STI) region, and a gate stack. In some embodiments, at least some of at least one of the first NP region, the first PP region, the second NP region, the second PP region, the STI region, or the gate stack is above at least some of the first region. In some embodiments, the first PP region is between the first NP region and the second NP region. In some embodiments, the second NP region is between the first PP region and the second PP region. In some embodiments, the gate stack is between the first PP region and the second NP region. In some embodiments, the STI region is between the second NP region and the second PP region. Accordingly, the first PP region facilitates a reduction of a trigger voltage associated with the NMOS transistor, thereby enabling the NMOS transistor to be triggered earlier during an ESD event, for example. Additionally, the first PP region facilitates an increase in a holding voltage associated with the NMOS transistor, thereby enabling the NMOS transistor to remain non-operational during normal operation of a circuit, for example.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
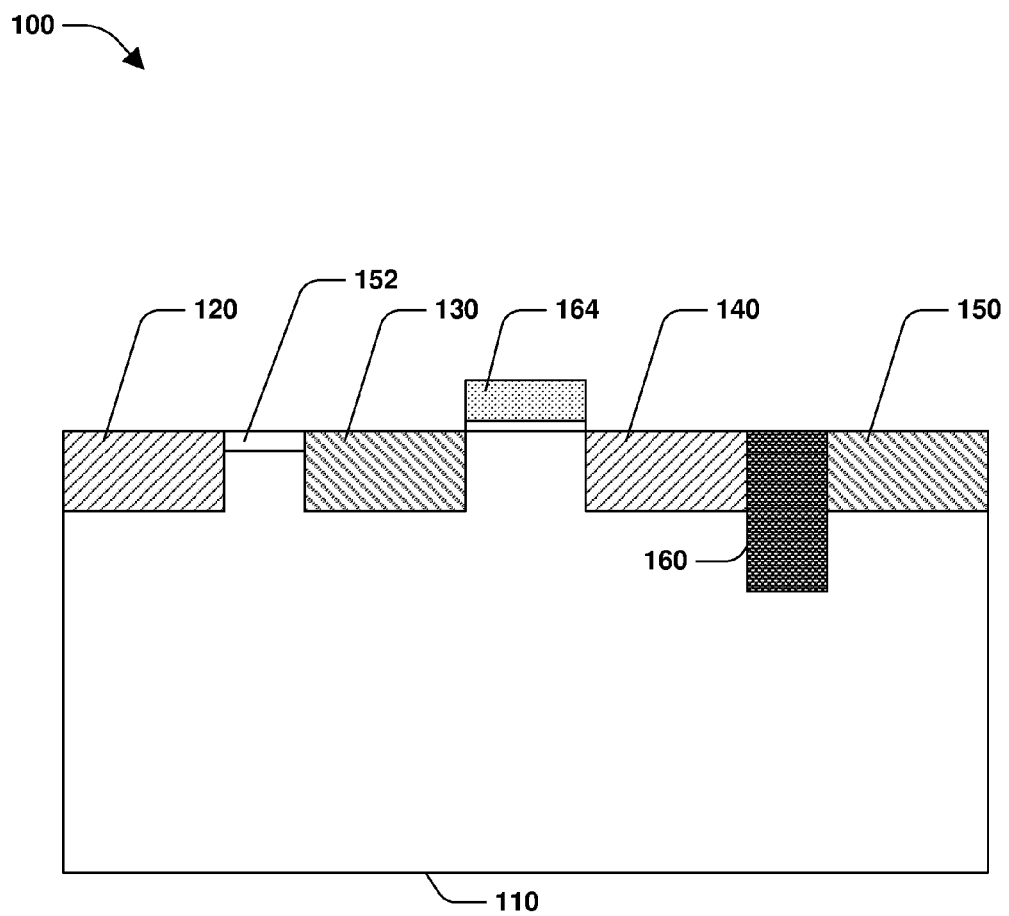
FIG. 1 is a cross-sectional view of an example n-type metal oxide semiconductor (NMOS) transistor for electrostatic discharge (ESD), according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness. Additionally a stack, such as a gate stack comprises one or more regions, according to some embodiments. It will be appreciated that 'between', as used herein, contemplates no overlap of regions in some scenarios, and at least some overlap of regions in other scenarios.

As used herein, the "+" symbol or a plus region is indicative of strong doping associated with a conductivity type. For example, N+ is indicative of a strongly doped N type region. Conversely, the "−" symbol or a minus region is indicative of weak doping associated with a conductivity type. For example, P− is indicative of a weakly doped P type region.

Figure 3:
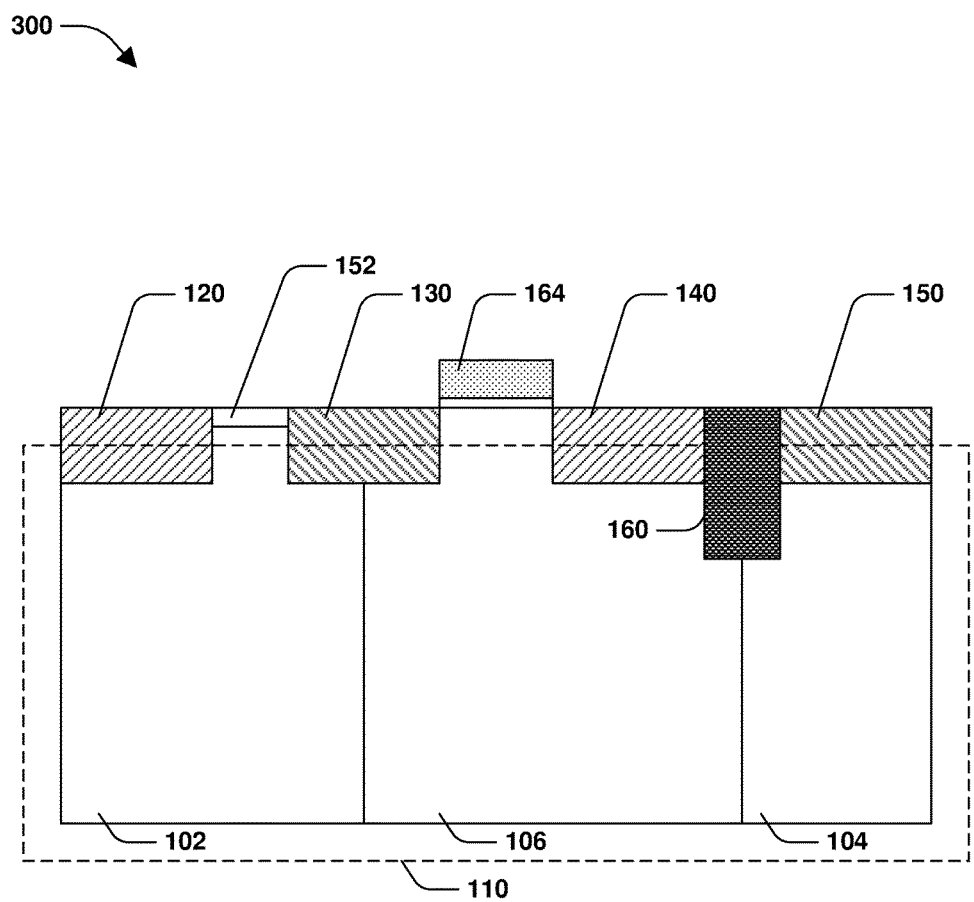
FIG. 3 is a cross-sectional view of an example n-type metal oxide semiconductor (NMOS) transistor for electrostatic discharge (ESD), according to some embodiments.
Figure 4:
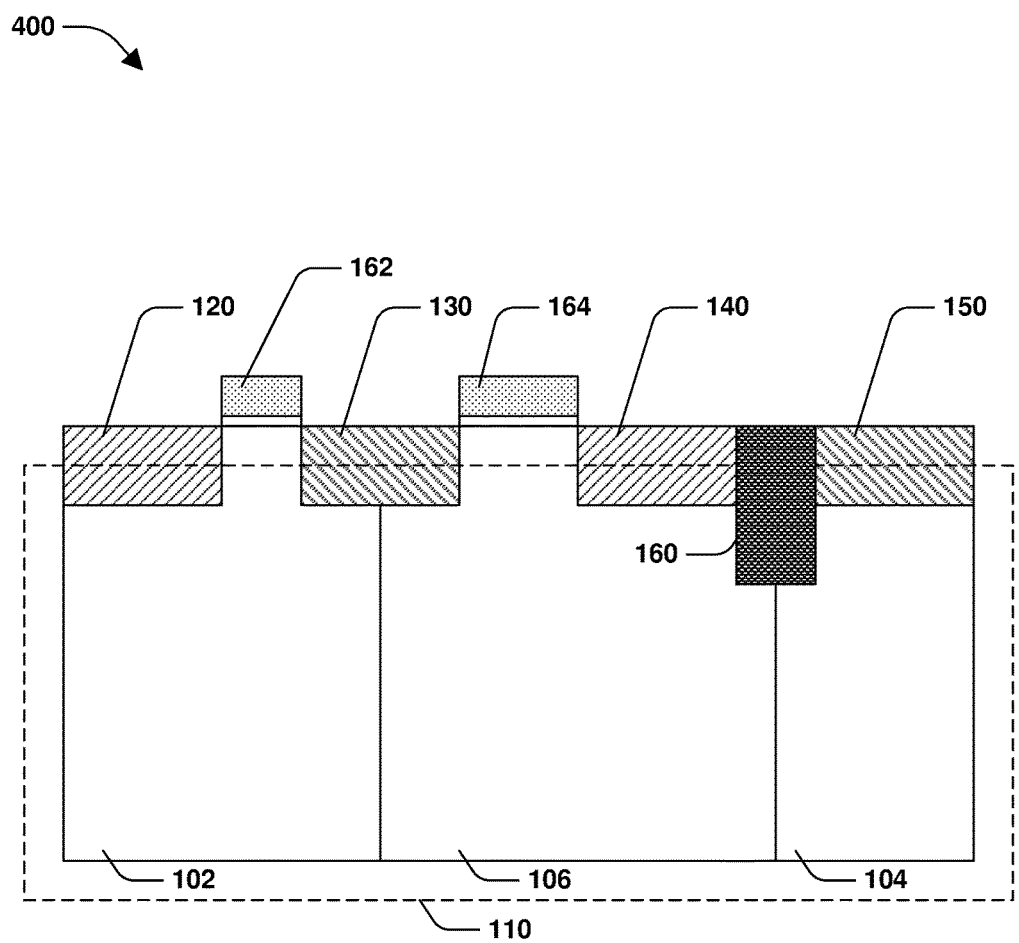
FIG. 4 is a cross-sectional view of an example n-type metal oxide semiconductor (NMOS) transistor for electrostatic discharge (ESD), according to some embodiments.

It will be appreciated that for at least some of the figures herein, one or more boundaries, such as boundary 110 of FIG. 3 or FIG. 4, for example, are drawn with different heights, widths, perimeters, aspect ratios, etc. relative to one another merely for illustrative purposes, and are not necessarily drawn to scale. For example, because dashed or dotted lines are used to represent different boundaries, if the dashed and dotted lines were drawn on top of one another they would not be distinguishable in the figures, and thus are drawn slightly apart from one another, in at least some of the figures, so that they are distinguishable from one another, for example. As another example, because a component is associated with an irregular shape, such as the first region 110, a box drawn with a dashed line, dotted lined, etc. does not necessarily encompass an entire component. For example, one or more portions of 110 are not encompassed by the dashed or dotted line associated with 110 of FIG. 3 or FIG. 4. Similarly, a drawn box does not necessarily encompass merely the associated component, but encompasses at least some of one or more other components as well, in some embodiments. For example, one or more portions of other regions are encompassed by the dashed or dotted line associated with 110 of FIG. 3 or FIG. 4. Accordingly, dimensions of some of these boundaries are drawn taller, shorter, wider, narrower, etc. than needed in some embodiments so that the different boundaries are visible in the figures, for example.

FIG. 1 is a cross-sectional view 100 of an example n-type metal oxide semiconductor (NMOS) transistor for electrostatic discharge (ESD), according to some embodiments. In some embodiments, the NMOS transistor comprises a first region 110, a first n-type plus (NP) region 120, a first p-type plus (PP) region 130, a second NP region 140, a second PP region 150, an epitaxy block region 152, a gate stack 164, and a shallow trench isolation (STI) region 160. In some embodiments, at least some of at least one of the first NP region 120, the first PP region 130, the second NP region 140, the second PP region 150, the epitaxy block region 152, the gate stack 164, or the shallow trench isolation (STI) region 160 is above at least some of the first region 110. In some embodiments, the first region 110 comprises a p-type well (PW) region. In some embodiments, the first region 110 comprises silicon.

In some embodiments, the first PP region 130 is between the first NP region 120 and the second NP region 140. In some embodiments, the second NP region 140 is between the first PP region 130 and the second PP region 150. In some embodiments, the gate stack 164 is between the first PP region 130 and the second NP region 150. In some embodiments, the STI region 160 is between the second NP region 140 and the second PP region 150. In some embodiments, the epitaxy block region 152 is between the first NP region 120 and the first PP region 130. In some embodiments, the first PP region 130 is between the epitaxy block region 152 and the gate stack 164. In some embodiments, the second NP region 140 is between the gate stack 164 and the STI region 160. In some embodiments, at least some of at least one of the first NP region 120, the first PP region 130, the second NP region 140, the second PP region 150, the epitaxy block region 152, or the shallow trench isolation (STI) region 160 are flush with at least one of a surface of the NMOS transistor or one another. In some embodiments, the epitaxy block region 152 is configured to mitigate leakage, at least because the epitaxy block region 152 comprises resist protective oxide (RPO), for example.

In some embodiments, the first NP region 120 is associated with a collector of an NMOS transistor. In some embodiments, the second NP region 140 is associated with an emitter of an NMOS transistor. In some embodiments, the second PP region 150 is associated with a base of an NMOS transistor.

In some embodiments, the NMOS transistor of FIG. 1 is formed in association with at least one of a FinFET (field effect transistor) process or a planar process. It will be appreciated that the NMOS transistor of FIG. 1 does not comprise an implant. Accordingly, the NMOS is not associated with additional processing required for implants, such as an additional mask, for example. In some embodiments, the first PP region 130 is configured to reduce a trigger voltage associated with the NMOS, at least because the first PP region 130 is part of a p-n junction that facilitates activation of the NMOS transistor. Additionally, it will be appreciated that a holding voltage associated with the NMOS transistor is increased, thus mitigating activation of the NMOS transistor during normal circuit operation, for example. In some embodiments, the holding voltage is increased at least due to a high doping concentration of the first PP region 130 associated with a path of current flow. In some embodiments, a latch up (LU) immunity is increased at least because the holding voltage is increased. Additionally, a capacitance associated with the NMOS is mitigated, at least because the first PP region 130 is not an implant region, for example. It will be appreciated that the trigger voltage associated with the NMOS of FIG. 1 is tunable based on the structure, for example.

In some embodiments, ESD discharge current flows from the first NP region 120 to the first region 110, to the first PP region 130, to the first region 110, to the second NP region 140. In some embodiments, the ESD discharge current flows from the first NP region 120 to the first region 110, to the second NP region 140.

Figure 2:
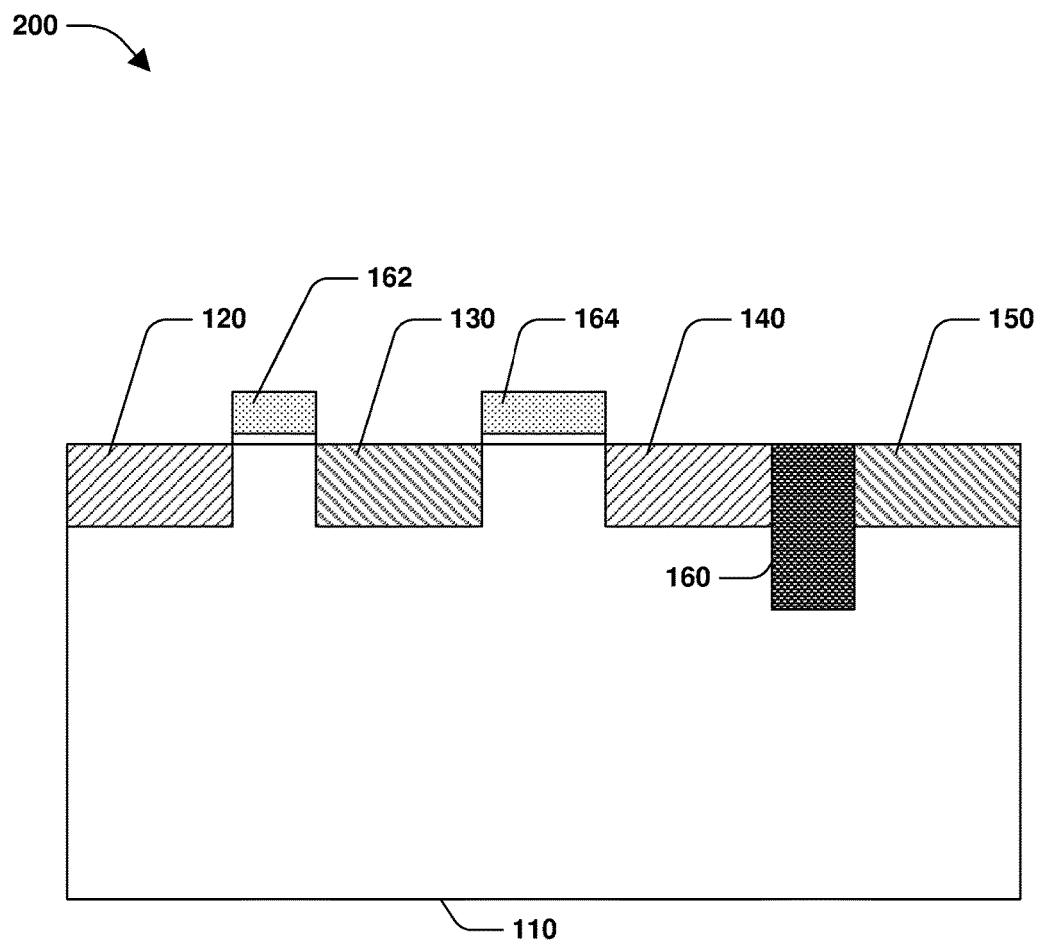
FIG. 2 is a cross-sectional view of an example n-type metal oxide semiconductor (NMOS) transistor for electrostatic discharge (ESD), according to some embodiments.

FIG. 2 is a cross-sectional view 200 of an example n-type metal oxide semiconductor (NMOS) transistor for electrostatic discharge (ESD), according to some embodiments. It will be appreciated that the NMOS transistor of FIG. 2 is similar to the NMOS transistor of FIG. 1, except that the NMOS transistor of FIG. 2 comprises a dummy gate stack 162. In some embodiments, at least some of the dummy gate stack 162 is above at least some of the first region 110. In some embodiments, the dummy gate stack 162 is between the first NP region 120 and the first PP region 130. In some embodiments, the first PP region 130 is between the dummy gate stack 162 and the gate stack 164. In some embodiments, at least some of at least one of the first NP region 120, the first PP region 130, the second NP region 140, the second PP region 150, or the shallow trench isolation (STI) region 160 are flush with at least one of a surface of the NMOS transistor or one another. In some embodiments, the dummy gate stack 162 and the gate stack 164 are at least one of flush with one another or associated with a similar height, for example. In some embodiments, the dummy gate stack 162 comprises RPO.

FIG. 3 is a cross-sectional view 300 of an example n-type metal oxide semiconductor (NMOS) transistor for electrostatic discharge (ESD), according to some embodiments. It will be appreciated that the NMOS transistor of FIG. 3 is similar to the NMOS transistor of FIG. 1, except that the first region 110 of the NMOS transistor of FIG. 3 comprises one or more regions. For example, the first region 110 of FIG. 3 comprises a first native NMOS blocked implant (NTN) region 102, a second NTN region 104, and a p-type well (PW) region 106. In some embodiments, the PW region 106 is between the first NTN region 102 and the second NTN region 104. In some embodiments, at least some of at least one of the first NP region 120, the epitaxy block region 152, or the first PP region 130 is above at least some of the first NTN region 102. In some embodiments, at least some of at least one of the first PP region 130, the gate stack 164, the second NP region 140, or the STI region 160 is above at least some of the PW region 106. In some embodiments, at least some of at least one of the STI region 160 or the second PP region 150 is above at least some of the second NTN region 104.

In some embodiments, the first PP region 130 is between the first NP region 120 and the second NP region 140. In some embodiments, the second NP region 140 is between the first PP region 130 and the second PP region 150. In some embodiments, the gate stack 164 is between the first PP region 130 and the second NP region 150. In some embodiments, the STI region 160 is between the second NP region 140 and the second PP region 150. In some embodiments, the epitaxy block region 152 is between the first NP region 120 and the first PP region 130. In some embodiments, the first PP region 130 is between the epitaxy block region 152 and the gate stack 164. In some embodiments, the second NP region 140 is between the gate stack 164 and the STI region 160. In some embodiments, at least some of at least one of the first NP region 120, the first PP region 130, the second NP region 140, the second PP region 150, the epitaxy block region 152, or the shallow trench isolation (STI) region 160 are flush with at least one of a surface of the NMOS transistor or one another.

In some embodiments, ESD discharge current flows from the first NP region 120 to the first NTN region 102, to the first PP region 130, to the PW region 106, to the second NP region 140. In other embodiments, the ESD discharge current flows from the first NP region 120 to the first NTN region 102, to the PW region 106, to the second NP region 140.

FIG. 4 is a cross-sectional view 400 of an example n-type metal oxide semiconductor (NMOS) transistor for electrostatic discharge (ESD), according to some embodiments. It will be appreciated that the NMOS transistor of FIG. 4 is similar to the NMOS transistor of FIG. 3, except that the NMOS transistor of FIG. 4 comprises a dummy gate stack 162. In some embodiments, at least some of the dummy gate stack 162 is above at least some of the first NTN region 102. In some embodiments, the dummy gate stack 162 is between the first NP region 120 and the first PP region 130. In some embodiments, the first PP region 130 is between the dummy gate stack 162 and the gate stack 164. In some embodiments, at least some of at least one of the first NP region 120, the first PP region 130, the second NP region 140, the second PP region 150, or the shallow trench isolation (STI) region 160 are flush with at least one of a surface of the NMOS transistor or one another. In some embodiments, the dummy gate stack 162 and the gate stack 164 are at least one of flush with one another or associated with a similar height, for example.

Figure 5:
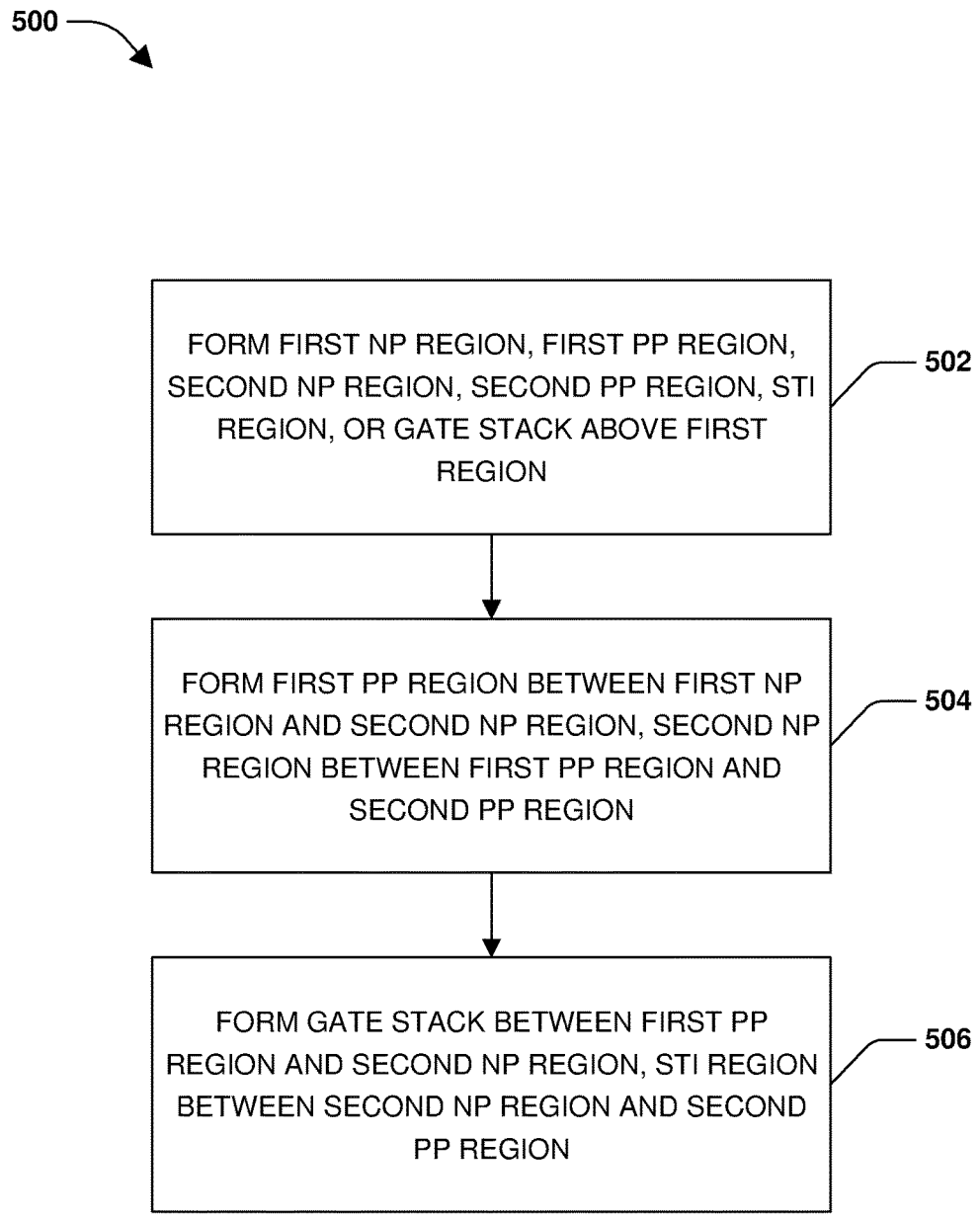
FIG. 5 is a flow diagram of an example method for forming an n-type metal oxide semiconductor (NMOS) transistor for electrostatic discharge (ESD), according to some embodiments.

FIG. 5 is a flow diagram of an example method 500 for forming an n-type metal oxide semiconductor (NMOS) transistor for electrostatic discharge (ESD), according to some embodiments. In some embodiments, the method 500 comprises forming a first region at 502. Additionally, a first NP region, a first PP region, a second NP region, a second PP region, an STI region, or a gate stack are formed above the first region at 502. At 504, the method 500 comprises forming the first PP region between the first NP region and the second NP region. Additionally, the method 500 comprises forming the second NP region between the first PP region and the second PP region at 504. In some embodiments, the method 500 comprises forming a gate stack between the first PP region and the second NP region. In some embodiments, the method 500 comprises forming the STI region between the second NP region and the second PP region.

According to some aspects, an n-type metal oxide semiconductor (NMOS) transistor for electrostatic discharge (ESD) is provided, comprising a first region. In some embodiments, the NMOS transistor comprises a first n-type plus (NP) region above at least some of the first region. In some embodiments, the NMOS transistor comprises a first p-type plus (PP) region above at least some of the first region. In some embodiments, the NMOS transistor comprises a second NP region above at least some of the first region. In some embodiments, the NMOS transistor comprises a second PP region above at least some of the first region. In some embodiments, the NMOS transistor comprises a shallow trench isolation (STI) region above at least some of the first region. In some embodiments, the NMOS transistor comprises a gate stack above at least some of the first region. In some embodiments, the first PP region is between the first NP region and the second NP region. In some embodiments, the second NP region is between the first PP region and the second PP region. In some embodiments, the gate stack is between the first PP region and the second NP region. In some embodiments, the STI region is between the second NP region and the second PP region.

According to some aspects, an n-type metal oxide semiconductor (NMOS) transistor for electrostatic discharge (ESD) is provided, comprising a first region comprising a p-type well (PW) region, a first native NMOS blocked implant (NTN) region, and a second NTN region. In some embodiments, the NMOS transistor comprises a first n-type plus (NP) region above at least some of the first NTN region. In some embodiments, the NMOS transistor comprises a first p-type plus (PP) region above at least some of at least one of the first NTN region or the PW region. In some embodiments, the NMOS transistor comprises a second NP region above at least some of the PW region. In some embodiments, the NMOS transistor comprises a second PP region above at least some of the second NTN region. In some embodiments, the NMOS transistor comprises a shallow trench isolation (STI) region above at least some of at least one of the PW region or the second NTN region. In some embodiments, the NMOS transistor comprises a gate stack above at least some of the PW region. In some embodiments, the first PP region is between the first NP region and the second NP region. In some embodiments, the second NP region is between the first PP region and the second PP region. In some embodiments, the gate stack is between the first PP region and the second NP region. In some embodiments, the STI region is between the second NP region and the second PP region.

According to some aspects, an n-type metal oxide semiconductor (NMOS) transistor for electrostatic discharge (ESD) is provided, comprising a first region. In some embodiments, the NMOS transistor comprises a first n-type plus (NP) region above at least some of the first region. In some embodiments, the NMOS transistor comprises a first p-type plus (PP) region above at least some of the first region. In some embodiments, the NMOS transistor comprises a second NP region above at least some of the first region. In some embodiments, the NMOS transistor comprises a second PP region above at least some of the first region. In some embodiments, the NMOS transistor comprises a shallow trench isolation (STI) region above at least some of the first region. In some embodiments, the NMOS transistor comprises a dummy gate stack above at least some of the first region. In some embodiments, the NMOS transistor comprises a gate stack above at least some of the first region. In some embodiments, the first PP region is between the first NP region and the second NP region. In some embodiments, the second NP region is between the first PP region and the second PP region. In some embodiments, the dummy gate stack is between the first NP region and the first PP region. In some embodiments, the gate stack is between the first PP region and the second NP region. In some embodiments, the STI region is between the second NP region and the second PP region.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, regions, elements, such as the first region, p-type well (PW) region, first NTN region, second NTN region, gate stack, dummy gate stack, shallow trench isolation (STI) region, first n-type plus (NP) region, second NP region, first p-type plus (PP) region, second PP region, epitaxy block region, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, regions, elements, etc. mentioned herein, such as implanting techniques, etching techniques, doping techniques, spin-on techniques, such as spin coating, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. An n-type metal oxide semiconductor (NMOS) transistor for electrostatic discharge (ESD), comprising:
   a first region;
   a first n-type plus (NP) region above at least some of the first region;
   a first p-type plus (PP) region above at least some of the first region;
   at least one of a resist protective oxide (RPO) region or a dummy gate stack above at least some of the first region and between the first NP region and the first PP region;
   a second NP region above at least some of the first region;
   a second PP region above at least some of the first region;
   a shallow trench isolation (STI) region above at least some of the first region; and
   a gate stack above at least some of the first region:
      the first PP region between the first NP region and the second NP region, and wherein no NP regions are between the first PP region and the gate stack,
      at least a portion of the first PP region vertically co-planar with at least a first portion of the gate stack;
      at least a portion of the second NP region vertically co-planar with at least a second portion of the gate stack and between the first PP region and the second PP region; and
      the STI region having a first sidewall in direct physical contact with the second NP region and a second sidewall in direct physical contact with the second PP region, the STI region extending an entire distance between the first sidewall and the second sidewall.

2. The NMOS transistor of claim 1, the first region comprising a p-type well (PW) region.

3. The NMOS transistor of claim 1, the NMOS transistor comprising the RPO region, the RPO region having a top surface substantially co-planar with a top surface of the first NP region, a bottom surface of the RPO region a first distance from the top surface of the RPO region and a bottom surface of the first NP region a second distance from the top surface of the first NP region, the first distance less than the second distance.

4. The NMOS transistor of claim 1, the at least one of the RPO region or the dummy gate stack adjacent the first NP region.

5. The NMOS transistor of claim 1, the first NP region associated with a collector of the NMOS transistor.

6. The NMOS transistor of claim 1, the second NP region associated with an emitter of the NMOS transistor.

7. The NMOS transistor of claim 1, the second PP region associated with a base of the NMOS transistor.

8. The NMOS transistor of claim 1, the first region comprising:
   a p-type well (PW) region;
   a first native NMOS blocked implant (NTN) region; and
   a second NTN region.

9. The NMOS transistor of claim 8, the PW region between the first NTN region and the second NTN region.

10. The NMOS transistor of claim 8:
   at least some of at least one of the first PP region, the gate stack, or the second NP region above at least some of the PW region;
   at least some of at least one of the first PP region or the first NP region above at least some of the first NTN region; and
   at least some of at least one of the second PP region or the STI region above at least some of the second NTN region.

11. An n-type metal oxide semiconductor (NMOS) transistor for electrostatic discharge (ESD), comprising:
   a first region comprising a p-type well (PW) region, a first native NMOS blocked implant (NTN) region, and a second NTN region;
   a first n-type plus (NP) region overlying at least some of the first NTN region;
   a first p-type plus (PP) region above at least some of at least one of the first NTN region or the PW region;
   a resist protective oxide (RPO) region between and in physical contact with the first NP region and the first PP region;

a second NP region above at least some of the PW region;
a second PP region overlying at least some of the second NTN region;
a shallow trench isolation (STI) region above at least some of at least one of the PW region or the second NTN region; and
a gate stack above at least some of the PW region:
the first PP region between the first NP region and the second NP region;
the second NP region between the first PP region and the second PP region;
a first portion of the first PP region in physical contact with the first NTN region and a second portion of the first PP region in physical contact with the PW region;
the STI region between the second NP region and the second PP region; and
no NP regions are between the first PP region and the gate stack.

12. The NMOS transistor of claim 11, a first portion of the STI region above the PW region and a second portion of the STI region above the second NTN region.

13. The NMOS transistor of claim 11, a first portion of the STI region in physical contact with the second NTN region and a second portion of the STI region in physical contact with the PW region.

14. The NMOS transistor of claim 11, the RPO region in physical contact with the first NTN region.

15. The NMOS transistor of claim 11, the PW region between the first NTN region and the second NTN region.

16. The NMOS transistor of claim 11, the first NP region associated with a collector of the NMOS transistor.

17. The NMOS transistor of claim 11, the second NP region associated with an emitter of the NMOS transistor.

18. The NMOS transistor of claim 11, the second PP region associated with a base of the NMOS transistor.

19. An n-type metal oxide semiconductor (NMOS) transistor for electrostatic discharge (ESD), comprising:
a first region;
a first n-type plus (NP) region above at least some of the first region;
a first p-type plus (PP) region above at least some of the first region;
a second NP region above at least some of the first region;
a second PP region above at least some of the first region;
a shallow trench isolation (STI) region above at least some of the first region;
a resist protective oxide (RPO) region above at least some of the first region; and
a gate stack above at least some of the first region:
the first PP region between the first NP region and the second NP region, and wherein no NP regions are between the first PP region and the gate stack;
the second NP region between the first PP region and the second PP region;
the RPO region between the first NP region and the first PP region;
the gate stack between the first PP region and the second NP region; and
the STI region between the second NP region and the second PP region.

20. The NMOS transistor of claim 19, the first region comprising:
a p-type well (PW) region;
a first native NMOS blocked implant (NTN) region; and
a second NTN region.

* * * * *